US012222370B2

(12) United States Patent
Ahn et al.

(10) Patent No.: US 12,222,370 B2
(45) Date of Patent: Feb. 11, 2025

(54) PROBE HEAD AND PROBE CARD HAVING SAME

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Sung Hyun Byun, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 128 days.

(21) Appl. No.: 17/919,739

(22) PCT Filed: Apr. 20, 2021

(86) PCT No.: PCT/KR2021/004942
§ 371 (c)(1),
(2) Date: Oct. 18, 2022

(87) PCT Pub. No.: WO2021/215790
PCT Pub. Date: Oct. 28, 2021

(65) Prior Publication Data
US 2023/0143340 A1    May 11, 2023

(30) Foreign Application Priority Data
Apr. 22, 2020   (KR) .................. 10-2020-0048660

(51) Int. Cl.
  *G01R 1/073* (2006.01)
  *G01R 1/067* (2006.01)
(52) U.S. Cl.
  CPC ..... *G01R 1/07371* (2013.01); *G01R 1/06755* (2013.01); *G01R 1/07342* (2013.01)

(58) Field of Classification Search
  CPC ............ G01R 1/07371; G01R 1/06755; G01R 1/07342; G01R 1/07378; G01R 1/07357; G01R 31/2889; G01R 1/067–06761
  (Continued)

(56) References Cited

U.S. PATENT DOCUMENTS

| 7,671,610 | B2 | 3/2010 | Kister |
| 9,110,130 | B2 | 8/2015 | Chen et al. |
| 2007/0114204 | A1* | 5/2007 | Cheng ................ G01R 1/07357 216/41 |

FOREIGN PATENT DOCUMENTS

| JP | 2018017575 | 2/2018 |
| KR | 1020110139827 | 12/2011 |

(Continued)

OTHER PUBLICATIONS

Higashida et al.; Translation of WO 2016/157964 A1; Oct. 6, 2016; EPO & Google (Year: 2016).*

(Continued)

*Primary Examiner* — Paresh Patel
*Assistant Examiner* — Rahul Maini
(74) *Attorney, Agent, or Firm* — JCIPRNET

(57) ABSTRACT

A probe head and a probe card having the same are provided. The probe head includes a plurality of guide plates each having a guide hole, wherein each of the guide plates has a shape in which a plurality of layers are stacked, and each of the guide plates includes: a first guide layer provided at a lowermost side thereof, and having a first guide hole; and a second guide layer provided at an uppermost side thereof, and having a second guide hole, wherein a side wall of the first guide hole and a side wall of the second guide hole are not provided on the same vertical line.

5 Claims, 9 Drawing Sheets

(58) Field of Classification Search
USPC ............ 324/754.01, 754.03, 754.07, 754.12, 324/754.13, 754.14
See application file for complete search history.

(56) References Cited

FOREIGN PATENT DOCUMENTS

| KR | 1020160084014 | | 7/2016 | | |
|---|---|---|---|---|---|
| KR | 1020170099383 | | 8/2017 | | |
| KR | 20170125070 | | 11/2017 | | |
| KR | 101823527 | B1 * | 1/2018 | ........... | G01R 1/0735 |
| WO | WO-2016157964 | A1 * | 10/2016 | ............ | G01R 1/073 |
| WO | 2018021140 | | 2/2018 | | |

OTHER PUBLICATIONS

Choudhary et al.; "Two-Step Cycle for Producing Multiple Anodic Aluminum Oxide (AAO) Films with Increasing Long-Range Order"; Pub. Date Jul. 11, 2016; RSC Adv.; 6(72); pp. 1-10 (Year: 2016).*
Ahn et al.; Translation of KR 101823527 B1; Pub. Date Jan. 30, 2018; Translated by Google & EPO (Year: 2018).*
"International Search Report (Form PCT/ISA/210) of PCT/KR2021/004942", mailed on Aug. 4, 2021, pp. 1-2.
"Office Action of Korea Counterpart Application", issued on Nov. 20, 2024, with English translation thereof, p. 1-p. 12.

* cited by examiner

[Fig. 2B]
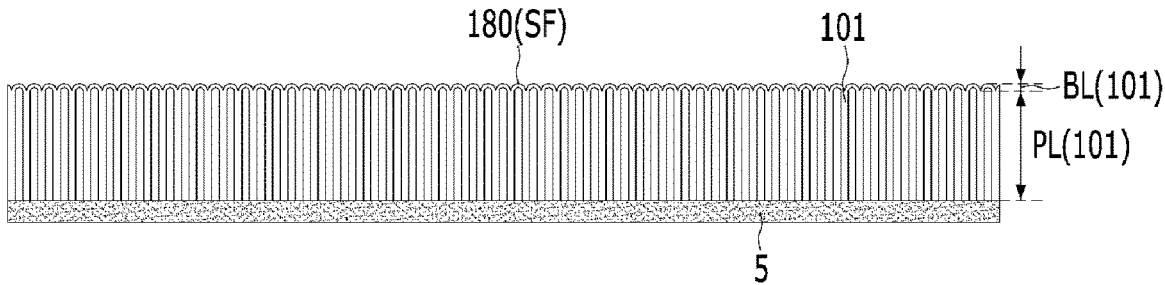
[Fig. 2C]
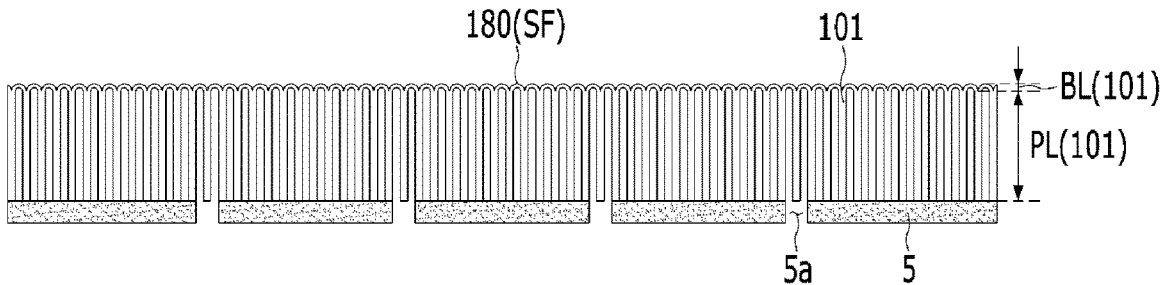
[Fig. 2D]
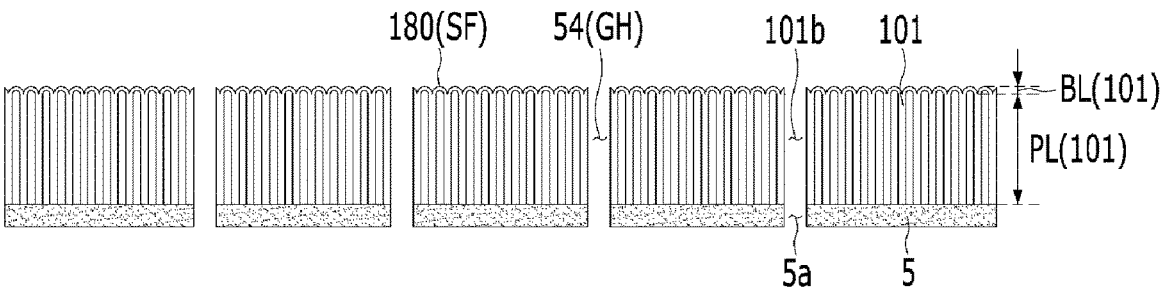
[Fig. 3]
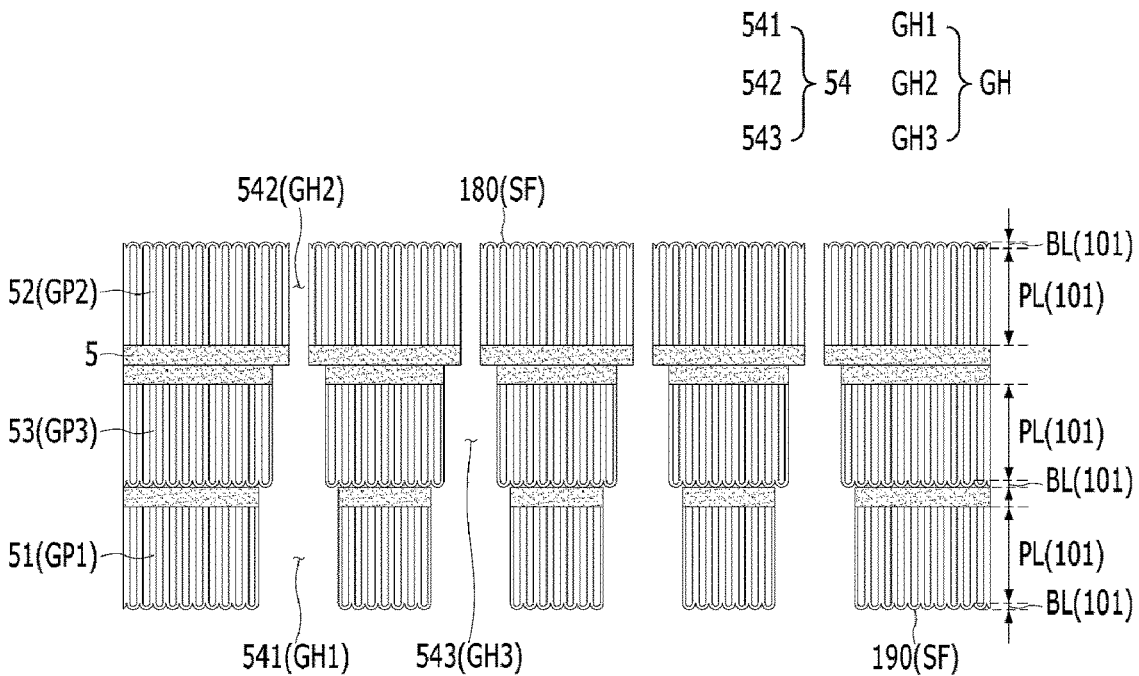

[Fig. 4A]
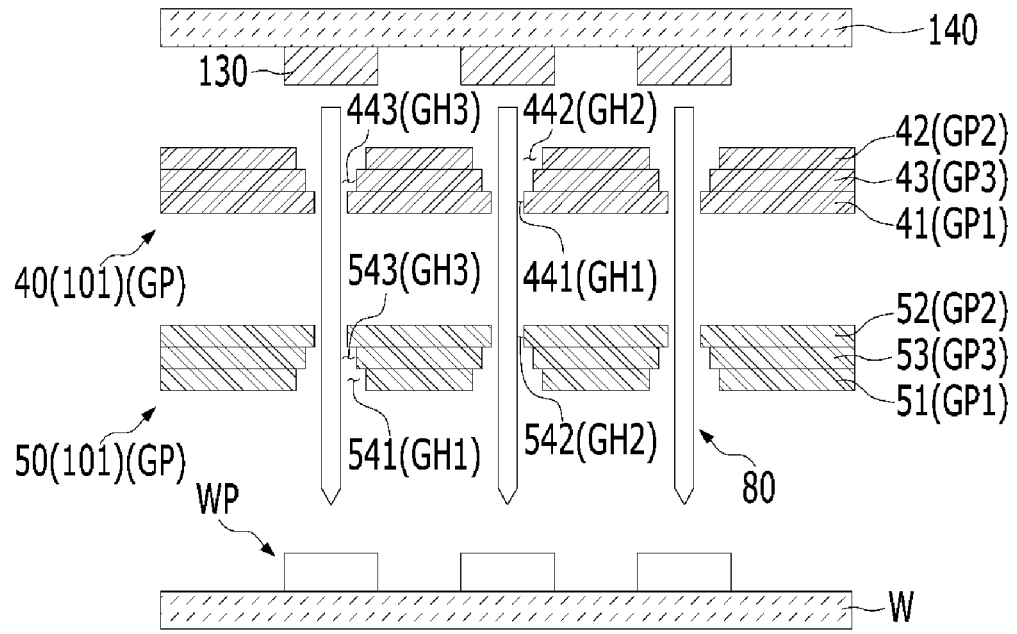
[Fig. 4B]
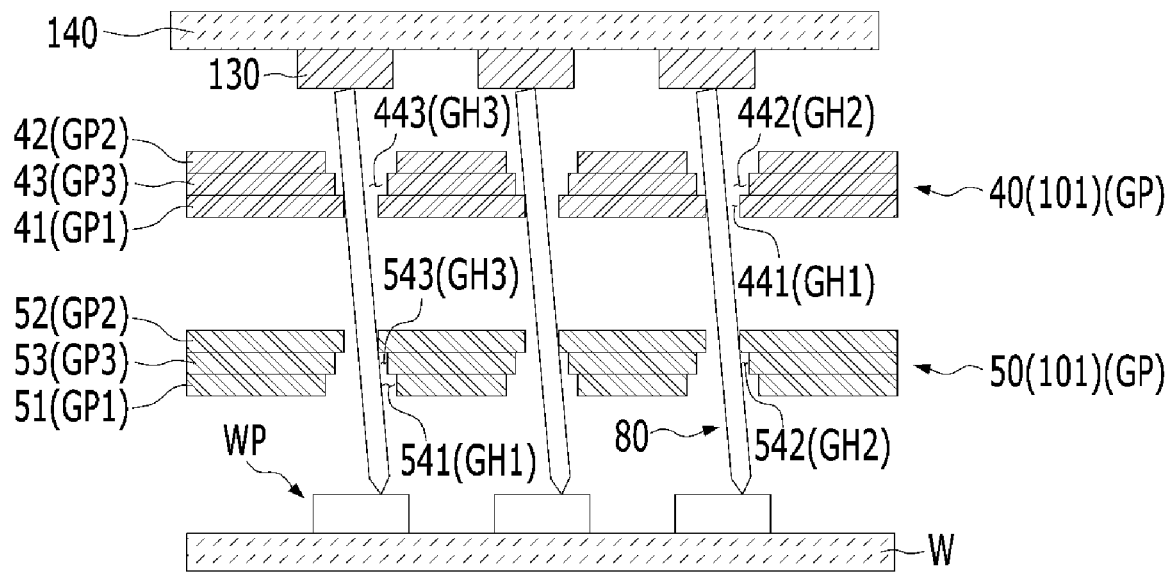

[Fig. 5A]
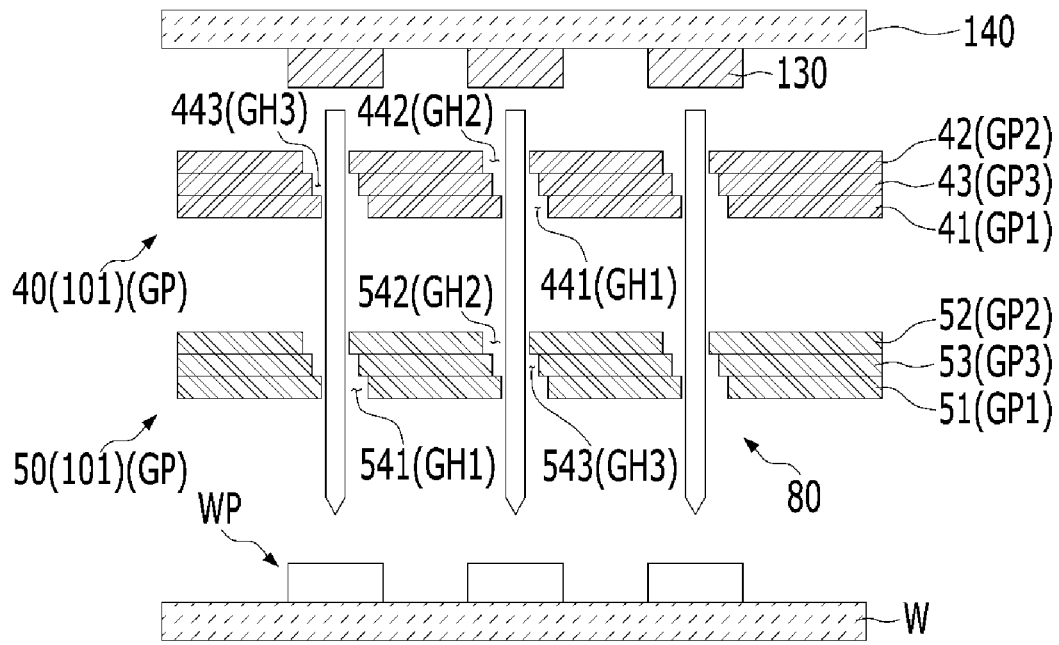
[Fig. 5B]
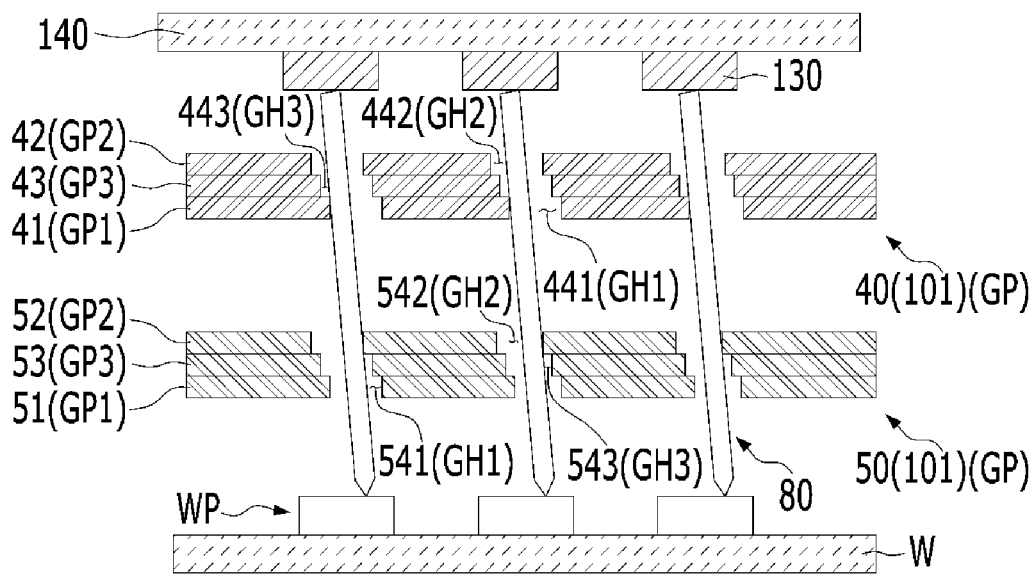

[Fig. 6A]
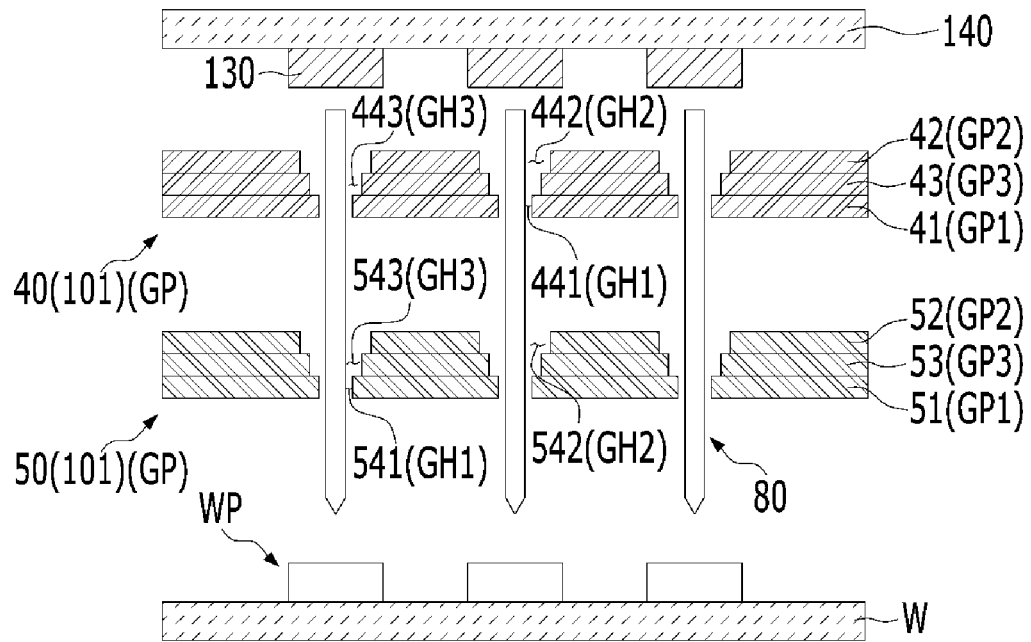
[Fig. 6B]
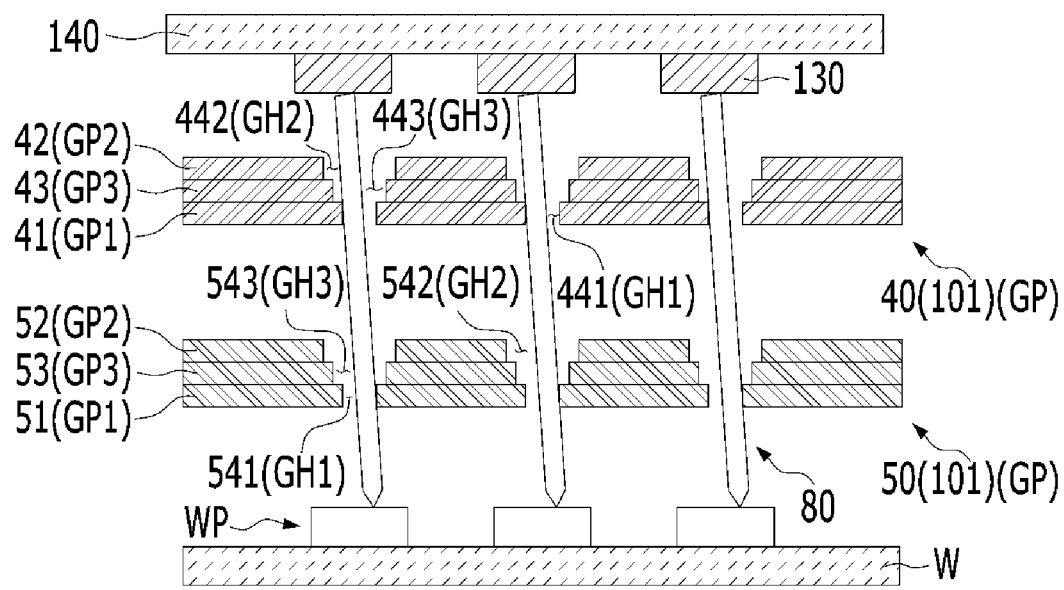

[Fig. 7A]
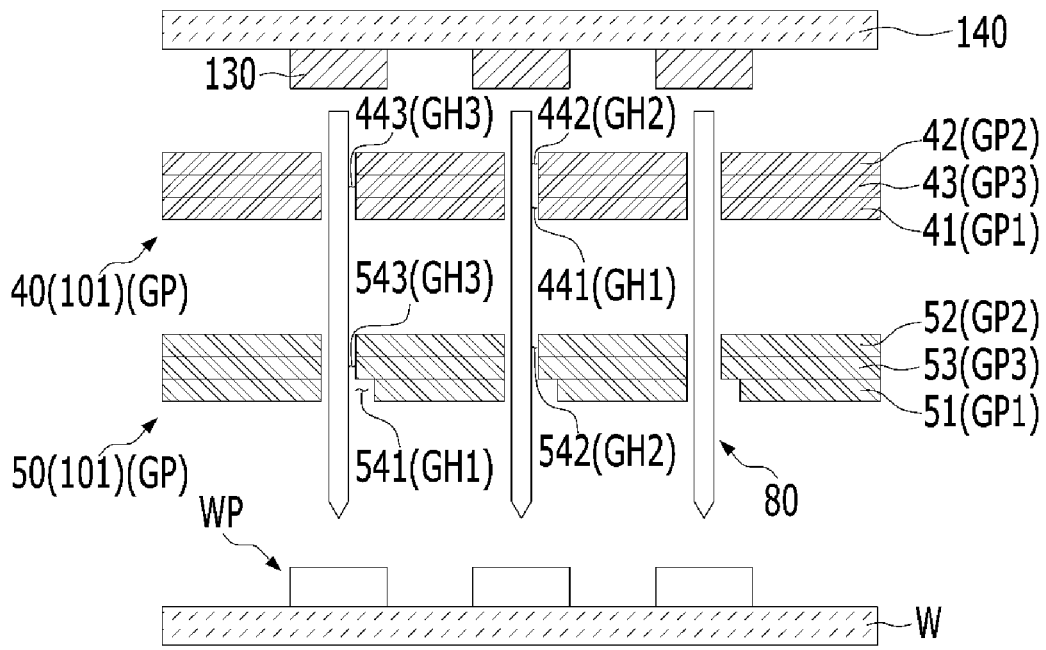
[Fig. 7B]
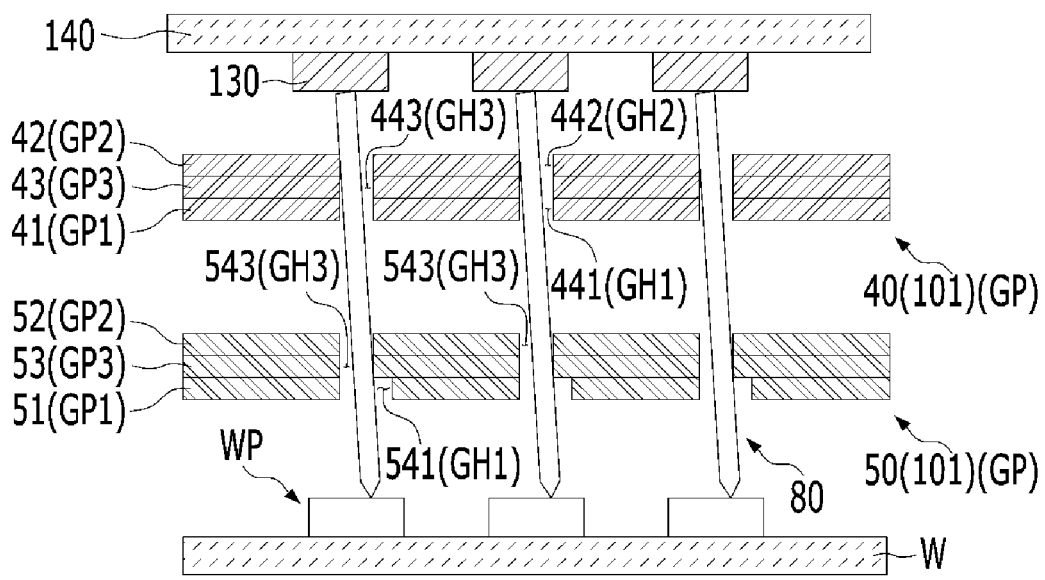

[Fig. 9A]
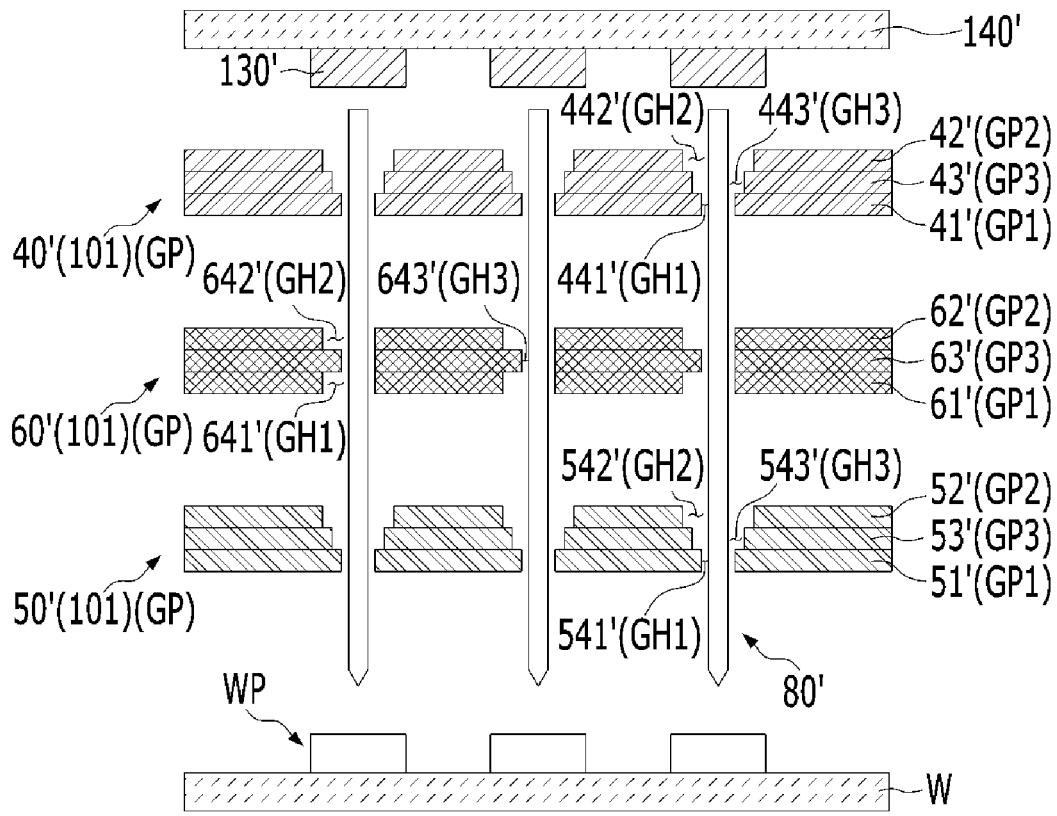
[Fig. 9B]
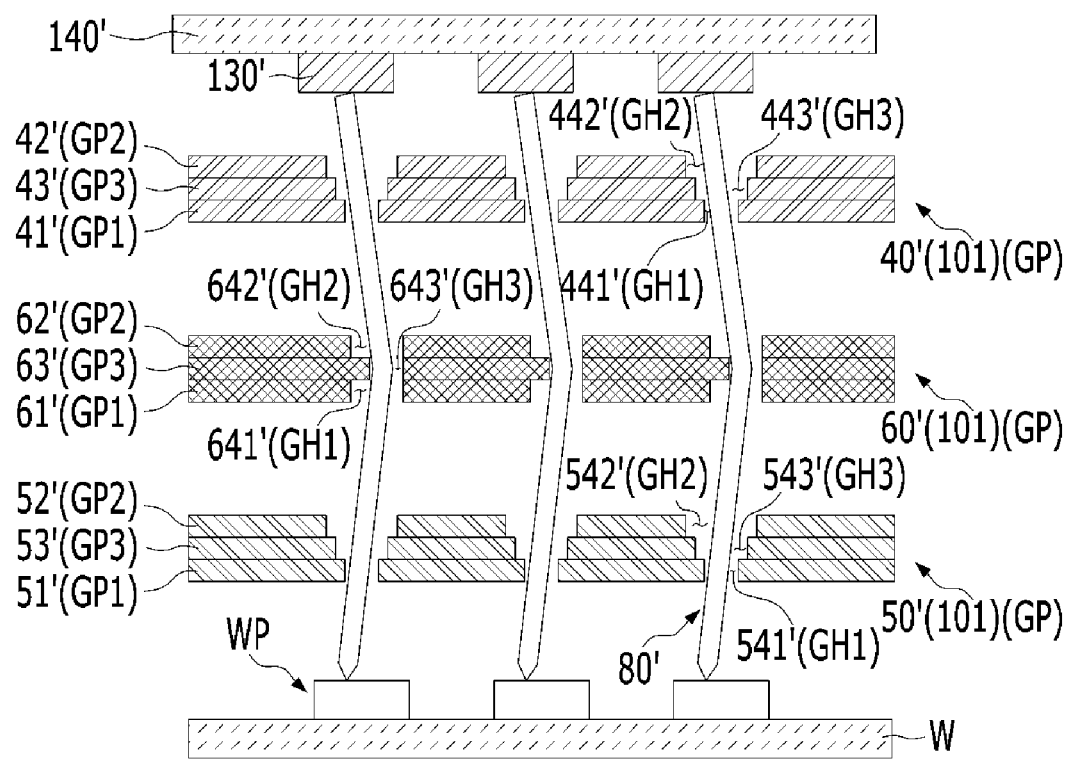

PROBE HEAD AND PROBE CARD HAVING SAME

TECHNICAL FIELD

The present disclosure relates generally to a probe head and a probe card having the same. More specifically, the present disclosure relates to a probe head that allows a probe to perform a scrubbing action while being allowed to be inclined within a guide hole, and a probe card having the same.

BACKGROUND ART

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which a pattern is formed to individual chips.

Here, the EDS process is performed to detect defective chips among the chips constituting the wafer. In the EDS process, a probe card which applies electrical signals to the chips constituting the wafer and determines whether the chips are defective on the basis of signals checked from the applied electrical signals is mainly used.

A probe card is a device that connects a semiconductor wafer (or a semiconductor device) and test equipment to test the operation of the semiconductor device, and serves to transmit electricity while connecting probes provided on the probe card to a wafer, and then sort defective semiconductor chips on the basis of feedback signals received thereby.

The probe card used for an electrical test of the semiconductor device may include a circuit board, an interposer, a space transformer, a probe head, and probes. In the probe card, an electrical path is provided through the circuit board, the interposer, the space transformer, and the probe head, and a pattern of a wafer is tested by the probes that directly contact the wafer.

The probe head supports the probes, and serves to prevent an electrical short due to contact between adjacent probes. Specifically, the probe head includes at least one guide plate, and the probes are inserted into guide holes formed in the guide plate and guided toward the wafer.

After the probes pass through the probe head, an upper side of each of the probes is brought into contact with a connection pad of the space transformer, while a lower side thereof is brought into contact with an electrode pad of the wafer. That is, by providing the space transformer and the wafer above and below the probes, respectively, the pattern of the wafer can be tested.

In case where the guide plate is configured so as to be easily deformed, the guide plate cannot support the probes, and the positions of the probes are changed thereby, with the result that the wafer cannot be properly tested.

An example of a patent that discloses a probe head for minimizing deformation of a guide plate is U.S. Pat. No. 9,110,130 (hereinafter referred to as "related art").

The related-art probe head is configured by stacking a ceramic lower guide plate and a plastic lower guide plate, and can support probes by minimizing thermal deformation of the lower guide plates.

However, the guide plate as above has through-holes that are formed in the same size in the plastic guide plate and the ceramic guide plate. Therefore, in a case of performing an overdrive process in which a wafer is further lifted by a predetermined height toward a probe card, probes cannot be inclined in one direction. As a result, there is a problem in that excessive contact pressure is generated, causing damage to electrode pads.

In the related art, the probes cannot be inclined more than a predetermined angle since each layer of the stacked lower guide plates has the same-size through holes. In addition, in case where the through-holes of the guide plate are configured to be larger than a predetermined size in order to incline the probes, a problem arises in that it is difficult to realize a fine pitch.

DOCUMENTS OF RELATED ART (Patent Document 1) Japanese Patent Application Publication No. 2018-17575

DISCLOSURE OF INVENTION

Technical Problem

Accordingly, the present disclosure has been made keeping in mind the above problems occurring in the related art, and an objective of the present disclosure is to provide a probe head that allows a probe to perform a scrubbing action while being allowed to be inclined within a guide hole, and a probe card having the same.

Another objective of the present disclosure is to provide a probe head and a probe card having the same, in which wafer test accuracy is increased by removing an oxide film of a probe connection pad.

Solution to Problem

In order to accomplish the above objectives, according to an aspect of the present disclosure, there is provided a probe head of a probe card, the probe head including: a plurality of guide plates each having a guide hole, wherein each of the guide plates may have a shape in which a plurality of layers are stacked, and each of the guide plates may include: a first guide layer provided at a lowermost side thereof, and having a first guide hole; and a second guide layer provided at an uppermost side thereof, and having a second guide hole, wherein a side wall of the first guide hole and a side wall of the second guide hole may not be provided on the same vertical line.

Furthermore, a center of the first guide hole and a center of the second guide hole may be provided on the same vertical line.

Furthermore, the first guide hole may have a larger size than the second guide hole.

Furthermore, the first guide hole may have a smaller size than the second guide hole.

Furthermore, each of the guide plates may include: a lower guide plate having a lower guide hole; and an upper guide plate provided above the lower guide plate, and having an upper guide hole, wherein at least one of the upper guide plate and the lower guide plate may include a first guide layer and a second guide layer, and the upper guide hole and the lower guide hole may have the same size.

Furthermore, the upper guide hole and the lower guide hole may have a symmetrical structure.

Furthermore, each of the guide plates may be made of an anodic aluminum oxide film formed by anodizing a metal as a base material.

According another aspect of the present disclosure, there is provided a probe card, including: a space transformer having a probe connection pad electrically connected to each of a plurality of probes; and a probe head provided below the space transformer, and having a plurality of guide plates having a shape in which a plurality of layers are stacked, wherein at least one of the guide plates may include: a first guide layer provided at a lowermost side thereof, and having a first guide hole; and a second guide layer provided at an uppermost side thereof, and having a second guide hole, wherein a side wall of the first guide hole and a side wall of the second guide hole may not be provided on the same vertical line.

Advantageous Effects of Invention

As described above, in the probe head and the probe card having the same according to the present disclosure, it is possible to allow a probe to scrub a probe connection pad while being allowed to be inclined in a guide hole.

In addition, it is possible to increase wafer test accuracy by removing an oxide film of a probe connection pad.

BRIEF DESCRIPTION OF DRAWINGS

FIGS. 2A to 2D are views illustrating a method of manufacturing a guide plate illustrated in FIG. 1.

FIG. 3 is a view illustrating a method of manufacturing guide plates illustrated in FIG. 1.

FIGS. 4A and 4B are views schematically illustrating guide plates, probes, a wafer, and a space transformer illustrated in FIG. 1, as viewed from one side.

FIGS. 5A and 5B are views illustrating a first modified example of a first embodiment.

FIGS. 6A and 6B are views illustrating a second modified example of the first embodiment.

FIGS. 7A and 7B are views illustrating a third modified example of the first embodiment.

FIGS. 9A and 9B are views schematically illustrating guide plates, probes, a wafer, and a space transformer illustrated in FIG. 8 as viewed from one side.

MODE FOR THE INVENTION

Figure 1:
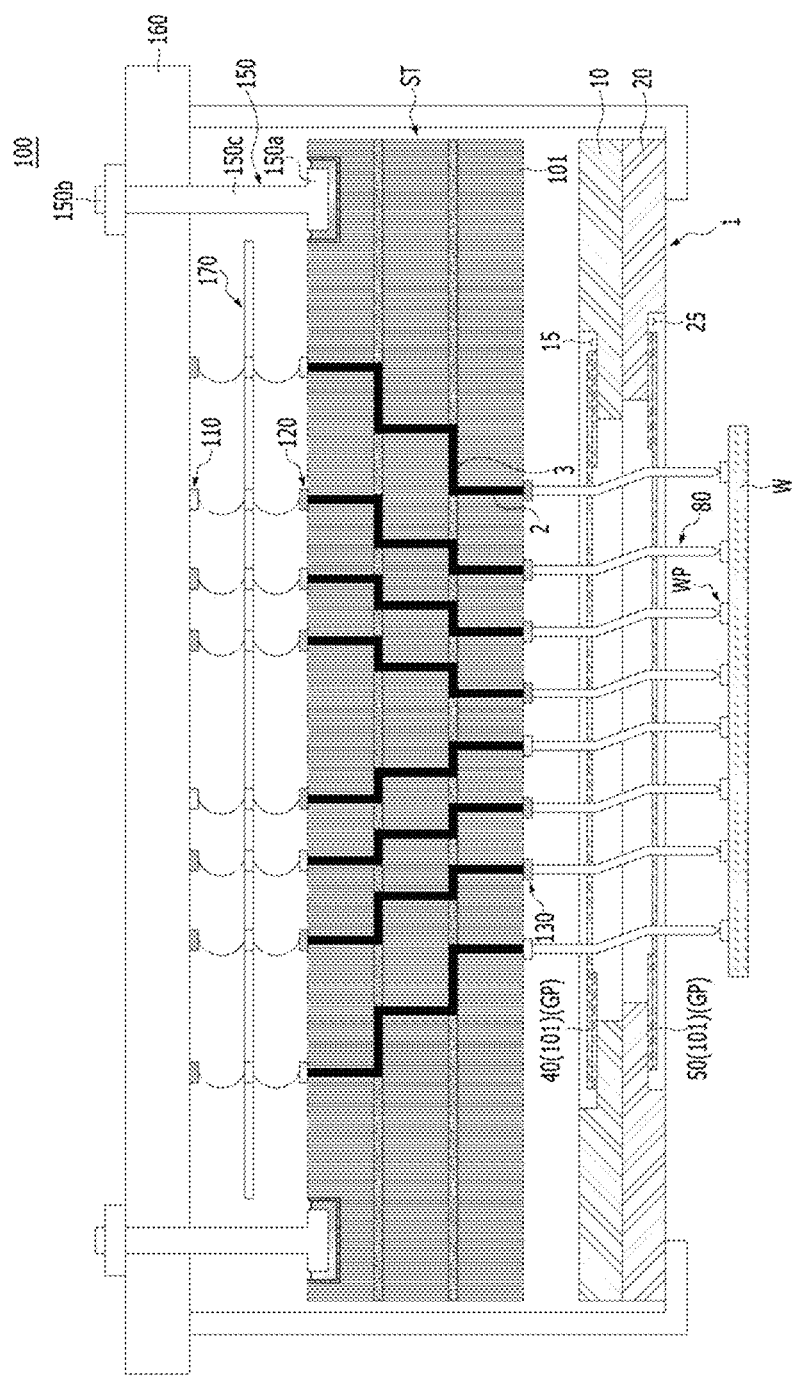
FIG. 1 is a view schematically illustrating a probe card according to an exemplary embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

FIG. 1 is a view schematically illustrating a probe card 100 according to an exemplary embodiment of the present disclosure. In this figure, for convenience of description, the number and size of a plurality of probes 80 are illustrated exaggeratedly.

Depending on the structure of installing the probes 80 on a space transformer ST and the structure of the probes 80, the types of the probe card 100 may be classified into a vertical type probe card, a cantilever type probe card, and a micro-electro-mechanical system (MEMS) probe card. In the present disclosure, as an example, a vertical type probe card 100 is illustrated to describe a coupling structure between the space transformer ST and other peripheral parts. The type of the probe card in which the coupling structure between the space transformer ST and other peripheral parts is implemented is not limited thereto, and may be the MEMS probe card and the cantilever type probe card.

FIG. 1 illustrates a contact state of electrode pads WP of a wafer W. A test for electrical characteristics of semiconductor devices is performed by approaching the wafer W to the probe card 100 having the plurality of probes 80 on a wiring substrate, and bringing the respective probes 80 into contact with corresponding electrode pads WP on the wafer W. After the probes 80 reach positions where the probes 80 are brought into contact with the electrode pads WP, the wafer W may be further lifted by a predetermined height toward the probe card 100. This process may be overdrive.

As illustrated in FIG. 1, the probe card 100 according to the present disclosure may include: the space transformer ST made of an anodic aluminum oxide film 101, and including a vertical wiring part 2, a horizontal wiring part 3 connected to the vertical wiring part 2, and a probe connection pad 130 electrically connected to each of the plurality of probes 80; and a coupling member 150 having a first end 150a fixed to a surface of the space transformer ST and a second end 150b coupled to a circuit board 160 provided above the space transformer ST. In this case, the coupling member 150 may be configured as a bolt, but is not limited thereto.

As illustrated in FIG. 1, the circuit board 160 may be provided above the space transformer ST, and a probe head 1 on which the plurality of probes 80 are provided may be provided below the space transformer ST. In other words, the space transformer ST may be located between the circuit board 160 and the probe head 1. The space transformer ST may be coupled to peripheral parts by the coupling member 150.

The space transformer ST coupled to the circuit board 160 by the coupling member 150 may be electrically connected thereto by an interposer 170 interposed between the circuit board 160 and the space transformer ST. Specifically, a first interposer connection pad 110 may be provided on an upper surface of the space transformer ST, and a second interposer connection pad 120 may be provided on a lower surface of the circuit board 160. Therefore, the interposer 170 interposed between the space transformer ST and the circuit board 160 may be joined to the first interposer connection pad 110 and the second interposer connection pad 120 to form an electrical connection between the space transformer ST and the circuit board 160.

The space transformer ST may be made of the anodic aluminum oxide film 101. The anodic aluminum oxide film 101 refers to a film formed by anodizing a metal that is a base material, and pores 101a refer to pores formed in the anodic aluminum oxide film 101 during the process of forming the anodic aluminum oxide film 101 by anodizing the metal. For example, in case where the metal as the base material is aluminum (Al) or an aluminum alloy, the anodization of the base material forms the anodic aluminum oxide film 101 consisting of anodized aluminum oxide ($Al_2O_3$) on a surface SF of the base material. The anodic aluminum oxide film 101 formed as such has a barrier layer BL in which no pores 101a are formed and a porous layer PL in which pores 101a are formed. The barrier layer BL is positioned on the base material, and the porous layer PL is positioned on the barrier layer BL. In a state in which the anodic aluminum oxide film 101 having the barrier layer BL and the porous layer PL is formed on the surface SF of the base material, when the base material is removed, only the anodic aluminum oxide film 101 consisting of anodized aluminum oxide ($Al_2O_3$) remains. The resulting anodic aluminum oxide film 101 has the pores 101a that have a uniform diameter, are formed in a vertical shape, and have a regular arrangement. In this case, when the barrier layer BL is removed, a structure in which the pores 101a vertically pass through the anodic aluminum oxide film 101 from top to bottom is formed.

The anodic aluminum oxide film 101 has a coefficient of thermal expansion of 2 to 3 ppm/° C. This may result in a small degree of deformation due to temperature.

According to the present disclosure, by configuring the space transformer ST using the anodic aluminum oxide film 101, the space transformer ST having a small degree of thermal deformation under a high-temperature environment may be implemented.

The probe head 1 is provided below the space transformer ST. The probe head 1 supports the probes 80 and includes a plurality of guide plates GP each having a guide hole GH. The probe head 1 may be manufactured by means of bolt fastening as an example.

Each of the guide plates GP has a shape in which a plurality of layers GP1, GP2, and GP3 (see FIG. 4) are stacked, and may include an upper guide plate 40 and a lower guide plate 50 according to location. In this case, at least one of the upper guide plate 40 and the lower guide plate 50 may be made of an anodic aluminum oxide film 101.

The upper guide plate 40 and the lower guide plate 50 may be supported by a first plate 10 and a second plate 20, respectively. Specifically, the second plate 20 may be provided under the first plate 10, and each of the first plate 10 and the second plate 20 may have a central space for allowing passage of the probes 80.

Specifically, the upper guide plate 40 may be provided in an upper seating region 15 formed on an upper surface of the first plate 10, and the lower guide plate 50 may be provided in a lower seating region 25 formed on a lower surface of the second plate 20. In this case, the upper seating region 15 may be configured as a concave recess in the upper surface of the first plate 10, and the lower seating region 25 may be configured as a concave recess in the lower surface of the second plate 20. However, since the concave recess shape of the upper seating region 15 and the lower seating region 25 is illustrated as an example, the shape thereof is not limited thereto. Therefore, the upper seating region 15 and the lower seating region 25 may be formed in a suitable shape to allow the upper guide plate 40 and the lower guide plate 50 to be provided on the upper surface of the first plate 10 and the lower surface of the second plate 20 more stably.

FIGS. 2A to 2D and FIG. 3 are views each illustrating a method of manufacturing a guide plate illustrated in FIG. 1.

A guide plate GP illustrated in FIGS. 2A to 2D may be at least one of an upper guide plate 40 and a lower guide plate 50, and hereinafter will be described as being the lower guide plate 50 as an example. In FIGS. 2A to 2D, for convenience of explanation, a portion of the lower guide plate 50 having a lower guide hole 54 is enlarged and schematically illustrated.

Figure 2A:
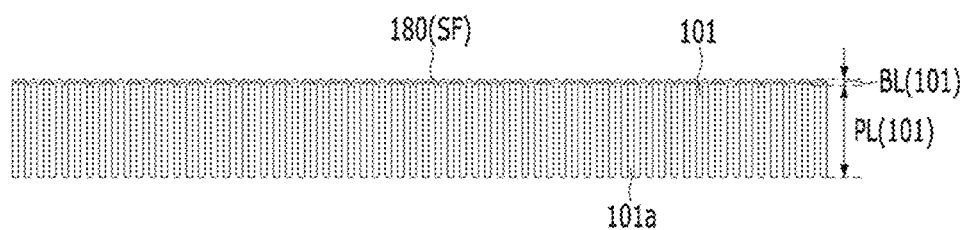

As illustrated in FIG. 2A, an anodic aluminum oxide film 101 including pores 101a may be provided. Then, as illustrated in FIG. 2B, a film 5 may be provided under the anodic aluminum oxide film 101. In this case, the anodic aluminum oxide film 101 may be provided in a state in which a barrier layer BL is not removed, and the barrier layer BL may be provided on an upper surface 180 of the anodic aluminum oxide film 101 on which the film 5 is not provided. That is, a porous layer PL may be provided between the barrier layer BL and the film 5. Since the upper surface 180 of the lower guide plate 50 may be configured as the barrier layer BL, a problem in which particles flow into the lower guide plate 50 through the pores 101a may be prevented. In addition, inner walls of openings of the guide plate GP, into which front ends of probes 80 are first inserted during insertion of the probes 80, may be positioned in the barrier layer BL having a high degree of density, thus having a high degree of durability. This may prevent abrasion of inner walls of openings of guide holes GH that may occur simultaneously with the insertion of the probes 80. As a result, a particle generation problem due to abrasion of the inner walls of the openings of the guide holes GH may be minimized.

As illustrated in FIG. 2C, at least a portion of the film 5 may be patterned by a photo process. Therefore, a plurality of film holes 5a may be formed in the film 5.

As illustrated in FIG. 2D, the anodic aluminum oxide film 101 may be etched through the film holes 5a, which are areas removed by patterning. Therefore, by such etching, a plurality of lower guide holes 54 corresponding to the film holes 5a may be formed in the anodic aluminum oxide film 101. That is, the lower guide holes 54 may be holes having the same size as the film holes 5a.

The lower guide plate 50 in which the lower guide holes 54 are formed may be provided on a second plate 20 after the film 5 is removed. However, without being limited thereto, the lower guide plate 50 may be provided on the second plate 20, with the film 5 provided thereon.

The film 5 may be made of a photosensitive material, and preferably, the film 5 is a photosensitive film capable of lithography. In addition, the film 5 may be a material capable of adhesion, and thus, the anodic aluminum oxide film 101 and the film 5 may be bonded without use of a separate adhesive means. The film 5 may be an epoxy, PI, or acrylate-based photoresist. As a more specific example, the film 5 may be SU-8, which is an epoxy-based resist in which eight epoxy groups are included in a single molecule.

In a conventional guide plate, insertion holes for probes are formed by mechanical processing such as laser or drilling processing. Therefore, a residual stress is generated when mechanically processing the insertion holes in the guide plate, resulting in a problem of deteriorating durability during use of a probe card. In addition, the holes formed by laser processing are not vertical, resulting in a problem in which a clearance occurs after insertion of the probes. On the contrary, in the lower guide plate 50 according to the present disclosure, since the lower guide holes 54 are formed by etching, the problems caused by mechanical processing may be prevented, and the lower guide holes 54 may have inner walls that are vertical in a straight line. Therefore, since the lower guide plate 50 may be made of a light-transmitting material, this may facilitate insertion of the probes 80, and since the inner walls of the lower guide holes 54 are straight, a clearance may be prevented from occurring.

As illustrated in FIG. 3, a lower guide plate 50 (GP) may be configured by stacking a plurality of anodic aluminum oxide films 101. In this case, the plurality of anodic aluminum oxide films 101 may be bonded together by a film 5.

Specifically, the lower guide plate 50 may include a first lower guide layer 51 (GP1) provided at a lowermost side thereof, a second lower guide layer 52 (GP2) provided at an uppermost side thereof, and a third lower guide layer 53 (GP3) provided between the first lower guide layer 51 (GP1) and the second lower guide layer 52 (GP2). In the present embodiment, although it is described as an example that the lower guide plate 50 is composed of three layers, but the structure of the lower guide plate 50 is not limited thereto.

A guide hole 54 (GH) may be formed in each of the guide layers 51, 52, and 53. Specifically, a first lower guide hole 541 (GH1) may be formed in the first lower guide layer 51 (GP1), and a second lower guide hole 542 (GH2) may be formed in the second lower guide layer 52 (GP2), and a third lower guide hole 543 (GH3) may be formed in the third lower guide layer 53 (GP3).

The first lower guide hole 541 (GH1), the second lower guide hole 542 (GH2), and the third lower guide hole 543 (GH3) may have different sizes. For example, of the first lower guide hole 541 (GH1), the second lower guide hole 52 (GH2), and the third lower guide hole 543 (GH3), the first lower guide hole 541 (GH1) may have the largest size, and the second lower guide hole 542 (GH2) may have the smallest size. In other words, the lower guide plate 50 may have a shape in which the respective guide holes GH gradually narrow upward. However, the sizes of the guide holes GH are illustrated an example, and the lower guide plate 50 may include guide holes GH of various sizes.

Since the lower guide plate 50 may be composed of the stacked anodic aluminum oxides 101, strength of the lower guide plate 50 may be increased. That is, the lower guide plate 50 may effectively support the probes 80.

In the present disclosure, only the method of manufacturing the lower guide plate 50 has been described, but when the upper guide plate 40 is made of an anodic aluminum oxide film 101, upper guide holes 44 (GH) may be formed through the same process. That is, as in case of the lower guide plate 50, the upper guide plate 40 may also include a first guide layer GP1, a second guide layer GP2, and a third guide layer GP3, and a first guide hole GH1, a second guide hole GH2, and a third guide hole GH3 may be formed in the guide layers GP1, GP2, and GP3, respectively.

Embodiment 1

FIGS. 4A and 4B are views schematically illustrating guide plates, probes, a wafer, and a space transformer illustrated in FIG. 1 as viewed from one side. In FIGS. 4A and 4B, a film 5 is omitted for convenience of description. However, each of an upper guide plate 40 and a lower guide plate 50 illustrated in FIGS. 4A and 4B may be configured by anodic aluminum oxide films 101 each having the film 5 thereon or thereunder as illustrated in FIG. 3.

Each of guide plates GP has a shape in which a plurality of layers are stacked, and may include a first guide layer GP1 having a first guide hole GH1, a second guide layer GP2 having a second guide hole GH2, and a third guide layer GP3 having a third guide hole GH3. That is, the guide plate GP may have guide holes GH including the first guide hole GH1, the second guide hole GH2, and the third guide hole GH3.

Specifically, the first guide layer GP1 may be provided at a lowermost side of the guide plate GP, the second guide layer GP2 may be provided at a lowermost side the guide plate GP, and the third guide layer GP3 may be provided between the first guide layer GP1 and the second guide layer GP2. That is, the guide plate GP may be formed in a structure in which the first guide layer GP1, the third guide layer GP3, and the second guide layer GP2 are sequentially stacked.

Each of the upper guide plate 40 and the lower guide plate 50 may have a structure including the first guide layer GP1, the second guide layer GP2, and the third guide layer GP3.

Specifically, the upper guide plate 40 may include a first upper guide layer 41 (GP1), a second upper guide layer 42 (GP2), and a third upper guide layer 43 (GP3). Therefore, the upper guide plate 40 may include a first upper guide hole 441 (GH1) formed in the first upper guide layer 41 (GP1), a second upper guide hole 442 (GH2) formed in the second upper guide layer 42 (GP2), and a third upper guide hole 443 (GH3) formed in the third upper guide layer 43 (GP3). In addition, the lower guide plate 50 may include a first lower guide layer 51 (GP1), a second lower guide layer 52 (GP2), and a third lower guide layer 53 (GP3). Therefore, the lower guide plate 50 may include a first lower guide hole 541 (GH1) formed in the first lower guide layer 51 (GP1), a second lower guide hole 542 (GH2) formed in the second lower guide layer 52 (GP2), and a third lower guide hole 543 (GH3) formed in the third lower guide layer 53 (GP3).

As illustrated in FIGS. 4A and 4B, the upper guide plate 40 may be configured so that among the guide holes GH, the first upper guide hole 441 (GH1) has the smallest size, and the second upper guide hole 442 (GH2) has the largest size. Therefore, the upper guide plate 40 may have the guide holes GH having a shape that gradually widens upward. In addition, the lower guide plate 50 may be configured so that among the guide holes GH, the first lower guide hole 541 (GH1) has the largest size, and the second lower guide hole 542 (GH2) has the smallest size. Therefore, the lower guide plate 50 may have the guide holes GH having a shape that gradually widens downward. That is, the upper guide holes 441, 442, and 443 of the upper guide plate 40 and the lower guide holes 541, 542, and 543 of the lower guide plate 50 may have shapes that are vertically symmetrical to each other, respectively. In other words, the upper guide plate 40 have the first guide hole GH1 smaller in size than the second guide hole GH2, and the lower guide plate 50 may have the first guide hole GH1 larger in size than the second guide hole GH2. In addition, the upper guide holes 441, 442, and 443 and the lower guide holes 541, 542, and 543 may have the same size, respectively, at positions vertically corresponding to each other, respectively.

As the first upper guide hole 441 (GH1), the second upper guide hole 442 (GH2), the third upper guide hole 442 (GH2) formed in respective guide layers 41, 42, and 43 of the upper guide plate 40 have different sizes, in case where respective centers of the first upper guide hole 441 (GH1), the second upper guide hole 442 (GH2), and the third upper guide hole 443 (GH3) are located on the same vertical line, respective side walls of the first upper guide hole 441 (GH1), the second upper guide hole 442 (GH2), and the third upper guide hole 443 (GH3) may not be located on the same vertical line. In addition, in case where respective centers of the first lower guide hole 541 (GH1), the second lower guide hole 542 (GH2), and the third lower guide hole 543 (GH3) of the lower guide plate 50 are located on the same vertical line, respective side walls of the first lower guide hole 541 (GH1), the second lower guide hole 542 (GH2), and the third lower guide hole 543 (GH3) may not be located on the same vertical line. Therefore, the side walls of the guide holes GH of each of the upper guide plate 40 and the lower guide plate 50 may have a shape stepped in one direction.

As illustrated in FIG. 4A, a plurality of probes 80 may sequentially pass through the upper guide plate 40 and the lower guide plate 50. In this case, the probes 80 may be provided in the upper guide plate 40 and the lower guide plate 50 in a vertical shape.

As illustrated in FIG. 4B, when a wafer W is moved upward in order to test the wafer W, as electrode pads WP of the wafer W and the probes 80 are brought into contact with each other, the probes 80 may be pushed upward by the wafer W. In this case, since the lower guide holes 541, 542, and 543 of the lower guide plate 50 may have a shape gradually widening downward and the upper guide holes 441, 442, and 443 of the upper guide plate 40 may have a shape gradually widening upward, the probes 80 may be inclined in one direction as making contact with the electrode pads WP. In addition, as the probes 80 are inclined, first sides of the probes 80 in contact with the electrode pads WP may be inclined while scratching surfaces of the electrode pads WP, and second sides of the probes 80 in contact with probe connection pads 130 may be inclined while scratching surfaces of the probe connection pads 130. That is, as being inclined along the shape of the guide holes GH, the probes 80 may remove oxide films of the surfaces of the electrode pads WP of the wafer W and the surfaces of the probe connection pads 130.

In a conventional laminated guide plate, each layer thereof has through-holes of the same size. Therefore, in a case of performing an overdrive process of lifting a wafer to a predetermined height toward a probe head, probes are pushed upward while making contact with electrode pads of the wafer, but cannot be inclined in one direction. As a result, excessive contact pressure may be generated on the electrode pads. On the contrary, since the guide plates GP of the present disclosure may have the guide holes GH that gradually widen upward or downward, this may secure a sufficient space for inclining of the probes 80 in contact with the electrode pads WP of the wafer W, while preventing, by a narrowest guide hole GH, the probes 80 from moving. That is, it may be possible for the probes 80 to scrub the oxide films formed on the surfaces of the electrode pads WP and the probe connection pads 130 without causing excessive contact pressure on the electrode pads.

In addition, as the oxide films of the surfaces of the electrode pads WP and the probe connection pads 130 disappear, accuracy of testing the wafer W may be increased.

FIGS. 5A and 5B are views illustrating a first modified example of the first embodiment.

Referring to FIGS. 5A and 5B, a first upper guide hole 441 (GH1), a second upper guide hole 442 (GH2), and a third upper guide hole 443 (GH3) of an upper guide plate 40 may have the same size. In this case, respective centers of the first upper guide hole 441 (GH1), the second upper guide hole 442 (GH2), and the third upper guide hole 443 (GH3) may be located on vertical lines that are not the same.

Specifically, when the upper guide plate 40 is configured by anodic aluminum oxide films 101, after a first upper guide layer 41, a second upper guide layer 42, and a third upper guide layer 43 are positioned to be misaligned, a guide hole GH having a predetermined size may be formed in each of the first, second, and third upper guide layers 41, 42, and 43. When the respective guide holes GH are formed in the upper guide plate 40, respective side surfaces of the upper guide layers 41, 42, and 43 may be rearranged so as not to be located on the same vertical line, and accordingly, respective centers of the upper guide holes 441, 442, and 443 formed in the upper guide layers 41, 42, and 43 may be located on vertical lines that are not the same. That is, respective side walls of the upper guide holes 441, 442, and 443 may be located on the vertical lines that are not the same, and accordingly, the side walls of the upper guide holes 441, 442 and 443 of the upper guide plate 40 may have a shape stepped in one direction. In addition, lower guide holes 541, 542, and 543 of a lower guide plate 50 may be formed in the same structure through the same process as the upper guide holes 441, 442, and 443 of the upper guide plate 40. That is, the upper guide plate 40 and the lower guide plate 50 may include guide holes GH inclined in the same direction.

As illustrated in FIG. 5A, a plurality of probes 80 may vertically pass through the upper guide plate 40 and the lower guide plate 50.

As illustrated in FIG. 5B, when a wafer W is moved upward in order to test the wafer W, as electrode pads WP of the wafer W and the probes 80 are brought into contact with each other, the probes 80 may be pushed upward by the wafer W. In this case, since a center connection line extending through the centers of the upper guide holes 441, 442, and 443 of the upper guide plate 40 and a center connection line extending through the centers of the lower guide holes 541, 542, and 543 of the lower guide plate 50 may be formed in a shape inclined in one direction, the probes 80 may be inclined in one direction to conform to the shape of the guide holes GH while making contact with the electrode pads WP. Therefore, first sides of the probes 80 may be inclined while scratching surfaces of the electrode pads WP, and second sides thereof may be inclined while scratching surfaces of probe connection pads 130. That is, the probes 80 may remove oxide films on the surfaces of the electrode pads WP and the probe connection pads 130 without causing excessive contact pressure on the surfaces thereof.

In addition, by simultaneously forming the guide holes GH of the same size in each of the upper guide plate 40 and the lower guide plate 50 and then changing the position of each of the guide holes 441, 442, 443, 541, 542, and 543, the guide holes GH of each of the upper guide plate 40 and the lower guide plate 50 may be easily formed in a shape in which the center connection line is inclined.

FIGS. 6A and 6B are views illustrating a second modified example of the first embodiment.

Referring to FIGS. 6A and 6B, first to third upper guide holes 441, 442, and 443 of an upper guide plate 40 and first to third lower guide holes 541, 542, and 543 of a lower guide plate 50 may have the same size and shape. Specifically, the upper guide plate 40 and the lower guide plate 50 may be configured so that among guide holes GH, the first upper and lower guide holes 441 and 541 (GH1) have the smallest sizes, and the second upper and lower guide holes 442 and 542 (GH2) have the largest sizes. That is, the guide holes GH of each of the upper guide plate 40 and the lower guide plate 50 may have a shape that gradually widens upward.

As illustrated in FIG. 6A, when a plurality of probes 80 are vertically inserted into the upper guide plate 40 and the lower guide plate 50, since the second guide holes GH2 may be the largest, each of the probes 80 may be easily inserted into the guide plates 40 and 50.

In addition, as illustrated in FIG. 6B, when electrode pads WP and the probes 80 are brought into contact with each other, since respective side walls of the guide holes GH of each of the upper guide plate 40 and the lower guide plate 50 may be inclined, the probes 80 may be inclined in one direction or the other. That is, the probes 80 may remove oxide films formed on surfaces of probe connection pads 130 and electrode pads WP without causing excessive contact pressure on the surfaces thereof.

FIGS. 7A and 7B are views illustrating a third modified example of the first embodiment.

Referring to FIGS. 7A and 7B, an upper guide plate 40 may have first to third upper guide holes 441, 442 and 443 (GH) having the same size, and a lower guide plate 50 may have a second lower guide hole 542 (GH2) and a third lower guide hole 543 (GH3) having the same size as the upper guide holes 441, 442, and 443 (GH). In this case, a first lower guide hole 541 (GH1) located at a lower most side of the lower guide plate 50 may have a larger size than the second lower guide hole 542 (GH2) and the third lower guide hole 543 (GH3).

Specifically, a first side wall of the first lower guide hole 541 (GH1) may be located on the same vertical line as respective first side walls of the second lower guide hole 542 (GH2) and the third lower guide hole 543 (GH3), and a second side wall of the first lower guide hole 541 (GH1) may not be located on the same vertical line as respective second side walls of the second lower guide hole 542 (GH2) and the third lower guide hole 543 (GH3). That is, the first lower guide hole 541 (GH1) may have a shape protruding in one direction from the second lower guide hole 542 (GH2) and the third lower guide hole 543 (GH3). In this case, the upper guide holes 441, 442, and 443 (GH) may be located on the same vertical line as the second lower guide hole 542 (GH2) and the third lower guide hole 543 (GH3).

As illustrated in FIG. 7A, a plurality of probes 80 may vertically pass through the upper guide plate 40 and the lower guide plate 50.

As illustrated in FIG. 7B, when a wafer W is moved upward in order to test the wafer W, as electrode pads WP of the wafer W and the probes 80 are brought into contact with each other, the probes 80 may be pushed upward by the wafer W. In this case, since the first lower guide hole 541 (GH1) at the lowermost side of the lower guide plate 50 is the largest, each of the probes 80 may be inclined in one direction by the position of the first lower guide hole 541 (GH1). Therefore, first sides of the probes 80 may be inclined while scratching surfaces of the electrode pads WP, and second sides thereof may be inclined while scratching surfaces of probe connection pads 130. That is, the probes 80 may remove oxide films on the surfaces of the electrode pads WP and the probe connection pads 130.

Embodiment 2

Hereinafter, a second embodiment of the present disclosure will be described. Compared to the first embodiment, the second embodiment has a difference in that an intermediate guide plate is further provided. Therefore, the difference will be mainly described, and the description and reference numerals of the first embodiment will be used for the same parts.

Figure 8:
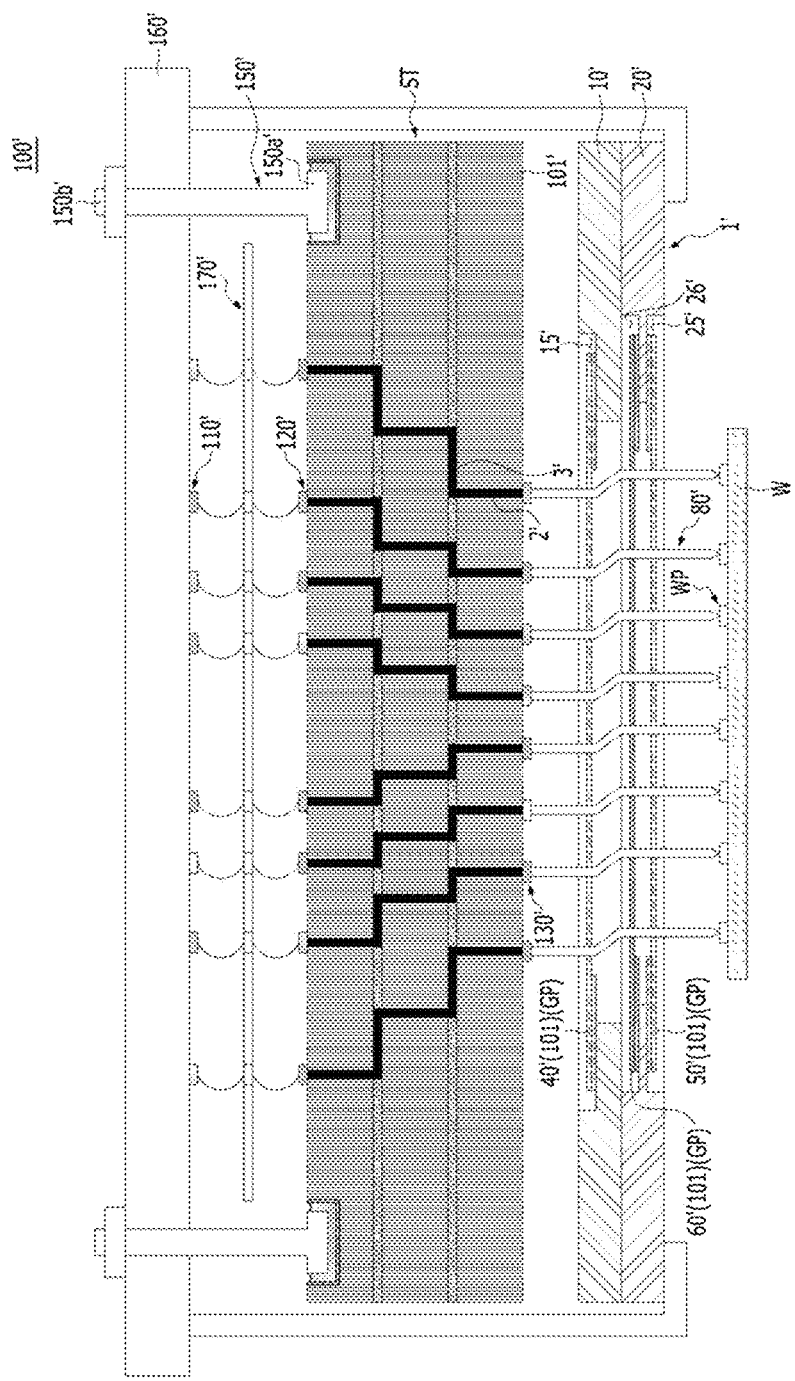
FIG. 8 is a view schematically illustrating a probe card according to a second embodiment of the present disclosure.

FIG. 8 is a view schematically illustrating a probe card according to the second embodiment of the present disclosure.

Referring to FIG. 8, a probe head 1' includes the intermediate guide plate 60'. The intermediate guide plate 60' is provided between an upper guide plate 40' and a lower guide plate 50', and may be provided at a side of a second plate 20'. However, the position of the intermediate guide plate 60' is not limited thereto, and may be provided at a side of a first plate 10'.

A plurality of probes 80' may sequentially pass through the upper guide plate 40', the intermediate guide plate 60', and the lower guide plate 50' to be provided toward a wafer W. Hereinafter, the intermediate guide plate 60' of the probe head 1' will be described in detail with reference to FIGS. 9A and 9B.

FIGS. 9A and 9B are views schematically illustrating guide plates, probes, a wafer, and a space transformer illustrated in FIG. 8 as viewed from one side.

Referring to FIGS. 9A and 9B, first to third upper guide holes 441', 442', and 443' of an upper guide plate 40' and first to third lower guide holes 541', 542', and 543' of a lower guide plate 50' may have the same size and shape. In this case, the guide holes GH of each of the upper guide plate 40' and the lower guide plate 50' may have a shape that gradually narrows downward.

A first intermediate guide hole 641'(GH) and a second intermediate guide hole 642' (GH) of the intermediate guide plate 60' may have the same size and shape, and a third intermediate guide hole 643' (GH) may have a smaller size than the first intermediate guide hole 641' (GH) and the second intermediate guide hole 642' (GH). In this case, a first side wall of the third intermediate guide hole 643' (GH) may be located on the same vertical as respective first side walls of the first intermediate guide hole 641' (GH) and the second intermediate guide hole 642' (GH), and a second side wall of the third intermediate guide hole 643' (GH) may not be located on the same vertical as respective second side walls of the first intermediate guide hole 641' (GH) and the second intermediate guide hole 642' (GH). That is, the guide holes GH of the intermediate guide plate 60' may have a shape in which the first side walls thereof are located on the same vertical and the second side walls thereof gradually narrow and then widen downward.

As illustrated in FIG. 9A, the vertical probes 80' may sequentially pass through the upper guide plate 40', the intermediate guide plate 60', and the lower guide plate 50'.

As illustrated in FIG. 9B, the vertical probes 80' may be elastically deformed in one direction. Specifically, when the probes 80' pass through the guide plates GP, the intermediate guide plate 60' may be moved in one direction. Therefore, the probes 80' may be elastically deformed in conjunction with the movement of the intermediate guide plate 60'. In the present embodiment, although it is described as an example that the intermediate guide plate 60' is moved in the right direction and an intermediate portion of each of the probes 80' is deformed in the right direction thereby, the moving direction of the intermediate guide plate 60' is not limited thereto.

After the probes 80' are elastically deformed in conjunction with the movement of the intermediate guide plate 60', when a wafer W is moved upward in order to test the wafer W, as electrode pads WP of the wafer W and the probes 80' are brought into contact with each other, the probes 80' may be pushed upward by the wafer W. In this case, since the first side walls of the guide holes GH of the intermediate guide plate 60' may have shape that gradually narrows and then widens downward, an intermediate portion of each of the probes 80' may be deformed conforming to the shape of the guide holes GH of the intermediate guide plate 60'. That is, the guide holes GH of the intermediate guide plate 60' guide a direction in which the probe 80' is to be deformed. This may provide an effect plurality of probes 80' are deformed equally by changing the shape of the guide holes GH even without requiring provision of a separate device.

While particular embodiments of the probe head and the probe card having the same according to the present disclosure have been described, it is merely illustrative and is not intended to limit the scope of the present disclosure and should be construed as having widest range based on the spirit of present disclosure. Those of ordinary skill in the art may combine and substitute the disclosed embodiments to perform a particular pattern of shape that has not been noted, but it is also within the scope of the present disclosure. It will be apparent to those of ordinary skill in the art that various changes and modifications may be readily made without departing from the spirit and scope of the present disclosure.

DESCRIPTION OF THE REFERENCE NUMERALS IN THE DRAWINGS 1, 1': probe head 10, 10', 10": first plate
100, 100': probe card
101, 101': anodic aluminum oxide film
101a, 101a': pore 130: probe connection pad
40, 40': upper guide plate
50, 50': lower guide plate
60, 60': intermediate guide plate
80, 80': probe
BL: barrier layer GH: guide hole
GP: guide plate PL: porous layer
SF: surface ST: space transformer
W: wafer WP: electrode pad

The invention claimed is:

1. A probe head of a probe card, the probe head comprising:
  a plurality of guide plates each having a guide hole,
  wherein at least one of the guide plates has a shape in which a plurality of guide layers are stacked, and
  at least one of the guide plates comprises:
    a first guide layer provided at a lowermost side thereof, and having a first guide hole; and
    a second guide layer provided at an uppermost side thereof, and having a second guide hole,
  wherein a side wall of the first guide hole and a side wall of the second guide hole are not provided on a same vertical line,
  wherein the first guide layer and the second guide layer are made of an anodic aluminum oxide film formed by anodizing a metal as a base material and removing the base material,
  wherein the plurality of the guide plates comprises: a lower guide plate having a lower guide hole; and an upper guide plate provided above the lower guide plate, and having an upper guide hole,
  wherein one of the upper guide plate and the lower guide plate includes the first guide layer and the second guide layer, and
  wherein the upper guide hole and the lower guide hole have a symmetrical structure.

2. The probe head of claim 1, wherein a center of the first guide hole and a center of the second guide hole are provided on a same vertical line.

3. The probe head of claim 2, wherein the first guide hole has a larger size than the second guide hole.

4. The probe head of claim 2, wherein the first guide hole has a smaller size than the second guide hole.

5. A probe card, comprising:
  a space transformer having a probe connection pad electrically connected to each of a plurality of probes; and
  a probe head provided below the space transformer, and having a plurality of guide plates having a shape in which a plurality of guide layers are stacked,
  wherein at least one of the guide plates comprises:
  a first guide layer provided at a lowermost side thereof, and having a first guide hole; and
  a second guide layer provided at an uppermost side thereof, and having a second guide hole,
  wherein a side wall of the first guide hole and a side wall of the second guide hole are not provided on a same vertical line,
  wherein the first guide layer and the second guide layer are made of an anodic aluminum oxide film formed by anodizing a metal as a base material,
  wherein the plurality of the guide plates comprises: a lower guide plate having a lower guide hole; and an upper guide plate provided above the lower guide plate, and having an upper guide hole,
  wherein one of the upper guide plate and the lower guide plate includes the first guide layer and the second guide layer, and
  wherein the upper guide hole and the lower guide hole have a symmetrical structure.

* * * * *